United States Patent [19]

Yokoyama

[11] Patent Number: 5,482,889
[45] Date of Patent: Jan. 9, 1996

[54] METHOD FOR PRODUCING OF SEMICONDUCTOR DEVICE HAVING OF CHANNEL STOPPER UNDER FIELD INSULATING LAYER

[75] Inventor: Hiroaki Yokoyama, Tokyo, Japan

[73] Assignee: NEC Corporation, Tokyo, Japan

[21] Appl. No.: 424,636

[22] Filed: Apr. 19, 1995

[30] Foreign Application Priority Data

Apr. 20, 1994 [JP] Japan ................................ 6-081590

[51] Int. Cl.[6] .................................................. H01L 21/76
[52] U.S. Cl. ...................... 437/70; 437/69; 437/28
[58] Field of Search ............................... 437/69, 70, 28, 437/233

[56] References Cited

U.S. PATENT DOCUMENTS

| | | | |
|---|---|---|---|
| 5,173,438 | 12/1992 | Sandhu | 437/28 |
| 5,196,367 | 3/1993 | Lu et al. | 437/70 |
| 5,254,495 | 10/1993 | Lur et al. | 437/69 |
| 5,286,672 | 2/1994 | Hodges et al. | 437/70 |
| 5,372,951 | 12/1994 | Anjum et al. | 437/70 |
| 5,397,727 | 3/1995 | Lee et al. | 437/70 |

FOREIGN PATENT DOCUMENTS

| | | | |
|---|---|---|---|
| 0054343 | 3/1982 | Japan | 437/70 |
| 63-293850 | 11/1988 | Japan . | |
| 64-68943 | 3/1989 | Japan . | |
| 1-297837 | 11/1989 | Japan . | |

*Primary Examiner*—Brian E. Hearn
*Assistant Examiner*—Trung Dang
*Attorney, Agent, or Firm*—Young & Thompson

[57] ABSTRACT

A method for the preparation of semiconductor devices which comprises steps of forming a nitride film on a first conductivity type semiconductor substrate, selectively removing the nitride film, oxidation with the remaining nitride film as the mask to form insulation oxide films for element isolation on the semiconductor substrate, forming a second insulation film on the entire surface of the substrate, and implanting a second conductivity type impurity through the entire surface of the substrate to form second conductivity type channel stoppers under the insulation oxide films.

10 Claims, 5 Drawing Sheets

METHOD FOR PRODUCING OF SEMICONDUCTOR DEVICE HAVING OF CHANNEL STOPPER UNDER FIELD INSULATING LAYER

BACKGROUND OF THE INVENTION

1. Field of the Invention

The present invention relates to a method for producing a semiconductor device and, more particularly, to a step of forming a channel stopper region under a field insulating-:film formed by the so-called local oxidation of a semiconductor substrate such as silicon.

2. Description of the Prior Art

Increasing degrees of integration demand provision of more minuscule element isolation regions. There are know, as element isolation techniques, LOCOS (Local Oxidation of Silicon) and LOPOS (Local Oxidation of Poly Silicon). Even if the isolation regions are formed fine, it is require to prevent parasitic MOS transistors from being rendered conductive. For this purpose, channel stopper layers are further formed under the field insulating films formed by the local oxidation to thereby enhance the threshold voltages of the parasitic MOS transistors. According to these conventional element isolation processes, however, since the formation of the thick insulation layers by the local oxidation and implantation of an impurity for the formation of the channel stopper layers are conducted in a self-aligning manner, the formed channel stopper layers expand undesirably to make each of active regions small.

More specifically, according to a prior art as shown in FIG. 1(a) through FIG. 1(d), a silicon oxide film 2, a polycrystalline silicon film 3 and a silicon nitride film 4 are successively layered on a silicon substrate 1 in that order. Then, the polycrystalline silicon film 3 and the silicon nitride film 4 are selectively etched away (FIG. 1(a)).

Thereafter, boron ions 9 are implanted (FIG. 1(b)), after which local oxidation is carried out to form field insulating films 7 (FIG. 1(c)) and channel stopper layers 10. During this process, the channel stopper layers 10 extending lateral direction. The layers 2, 3 and 4 are then removed, followed by forming gate oxide films 11 and polysilicon gates 18. High impurity concentration layers 16 as source/drain regions are then formed to form MOS transistors (FIG. 1(d)) by using the gates 18 and field oxide layers 7 as a mask.

For this reason, as is apparent from FIG. 1(d), the respective parts of the P-type channel stopper layers 7 extended in lateral directions and the parts of the layers 16 form overlap regions 17. $P^+-N^+$ functions are present in these overlap regions 17. As a result, the junction capacitance rises resulting in increase in a leakage current. If this method is applied to a dynamic memory device, the data storage characteristics of each memory cell are deteriorated.

Some techniques have been proposed to solve this problem. For example, Japanese Laid-Open Application No. Sho 64-68943 and Japanese Laid-Open Application No. Hei 1-297837 disclose such a method that involves implantation of boron ions into the substrate through field insulating films. The lateral expansion of the channel stopper is thereby suppressed.

However, this method causes boron ions further to be implanted into the substrate portions below the channel region of the transistor and below the source/drain regions. For this reason, the characteristics of the transistors are made changed and the junction capacitance is also increased.

The above drawback may be solved by the method as described in Japanese Laid-Open Application No. Sho 63-293850. The description on this method will be made below with reference to FIG. 2(a) through FIG. 2(f).

As shown in FIG. 2(a), a silicon substrate 1 is thermally oxidized to form an approximately 20 nm-thick silicon oxide film 2, followed by forming, as an antioxidant film or an oxidation-resist film, a silicon nitride film 4 in about 120 nm thick by the so-called CVD method. A polycrystalline silicon film 3 is then formed on the silicon nitride film 4 on which a second silicon nitride film 5 is then layered by CVD to a thickness of approximately 30 nm.

Photolithography is then used to leave the respective parts of the second silicon nitride film 5, polycrystalline silicon film 3 and first silicon nitride film 4 located on element formation regions, as shown in FIG. 2(b).

An approximately 30 nm-thick third silicon nitride film 6 is thereafter deposited over the entire surface by CVD. The anisotropic dry etching is then carried out to form sidewalls 6 made of silicon nitride film on the side surfaces of the first silicon nitride film 4, polycrystalline silicon film 3 and second silicon nitride film 5, as shown in FIG. 2(c). Thus, the silicon nitride sidewalls 6 cooperate with the silicon nitride films 4 and 5 to completely surround the polycrystalline silicon films 3. Accordingly, the polycrystalline silicon film 3 is protected from being oxidized against the subsequent thermal oxidation step.

Local oxidation is the conducted by using the first silicon nitride film 4, polycrystalline silicon film 3, second silicon nitride film 5 and silicon nitride sidewalls 6 as a mask. Thick field oxide films 7 are thereby formed in thickness of about 500 nm as element isolation regions, as shown in FIG. 2(c).

A polycrystalline silicon film is thereafter deposited over the entire surface, followed by performing the anisotropic dry etching. As a result, polycrystalline silicon sidewalls 8 are formed on the side surfaces of the respective nitrogen silicon sidewalls 6, as shown in FIG. 2(d).

By using the remaining silicon nitride film 4, polycrystalline silicon film 3, second silicon nitride film 5, silicon nitride sidewalls 6 and polycrystalline silicon sidewalls 8 as a mask, boron ions 9 are implanted to form P-type channel stopper layers 10. At this time, the polycrystalline silicon film 3 operates to prevent the penetration of the boron ions 9 into the silicon substrate 1. Accordingly, the channel stopper regions 10 are formed only under the field oxide layers 7, as shown in FIG. 2(e). The polycrystalline silicon film made sidewalls 8, silicon nitride sidewalls 6, second silicon nitride film 5, polycrystalline silicon film 3, first silicon nitride film 4 and silicon oxide film 2 are then removed.

As shown in FIG. 2(f), a gate insulation film 11 is thereafter formed in a thickness of approximately 20 nm, followed by patterning to form a contact hole 12. Gate electrodes 13 with a thickness of about 300 nm are then formed on the gate insulation film 11 by CVD. The gate electrodes 13 have a so-called polycide structure composed of a polycrystalline silicon layer and a refractory metal (a high-melting metal) silicide. By the well-known processes, the so-called LDD MOS transistors are formed having lightly doped layers 14 and highly doped layers 16. Thus, fine pattern field isolation regions 7 as well as fine channel stopper regions 10 are formed.

However, the dry etching for forming the polycrystalline silicon sidewalls 8 also etches partially the field insulating films 7 to reduce the film thickness thereof. For this reason, the threshold voltage of the parasitic MOS transistor is lowered. Furthermore, since the deposition of a layer and the etchback thereof are repeated twice to form the sidewalls 6 and 8, resulting in the complicated process. The yields of the products is thereby lowered and the cost is increased.

BRIEF SUMMARY OF THE INVENTION

OBJECTS OF THE INVENTION

Accordingly, it is an object of the present invention to provide a method for producing a semiconductor device in which a fine pattern in channel stopper is obtained without decreasing the thickness of field insulating films.

It is another object of the present invention to provide a method for producing a semiconductor device in which a fine pattern in channel stopper is obtained with reducing the number of steps.

SUMMARY OF THE INVENTION

A method for producing a semiconductor device according to the present invention comprises the steps of providing a semiconductor substrate having element formation portion and a field isolation portion, covering the element formation portion of the semiconductor substrate, with a mask layer having a top layer made of silicon nitride, selectively oxidizing the substrate by using the mask layer as a mast to thereby form a field oxide film on the field isolation portion of the semiconductor substrate, a forming a film on the entire surface of the mask layer and the field oxide layer, and a implanting impurities into the substrate to form a channel stoppers under the field oxide films while leaving the film.

BRIEF DESCRIPTION OF THE DRAWINGS

The aforementioned and other objects, features and advantages of the present invention will become more apparent with reference to the following detailed description of the invention taken in conjunction with the accompanying drawings, wherein.

DETAILED DESCRIPTION OF THE PREFERRED EMBODIMENT

Referring now to FIG. 3, the description on an embodiment of the present invention will now be made in detail below. As shown in FIG. 3(a), a silicon substrate 1 of a P-type as one conductivity type is thermally oxidized to form an approximately 20-nm silicon oxide film 2, followed by forming a polycrystalline silicon film 3 and a first silicon nitride film 4 in that order by the CVD method. Here, the film thickness of the polycrystalline silicon film 3 and that of the silicon nitride film 4 are controlled such that boron ions for formation of channel stopper layers do not penetrate there through and not reach the silicon substrate 1. In the case where the boron ions are implanted at an accelerating voltage of 150 kV and at a dose of $1.5 \times 10^{13}$ cm$^{-2}$, it is appropriate to set the film thickness of the polycrystalline silicon film 3 to be approximately 80 nm, and the film thickness of the silicon nitride film 4 to be on the order of 400 nm. It is further to be noted that the polysilicon film 3 is sandwiched between the silicon oxide film 2 and the nitride film 4 and that the silicon oxide film 2 and polycrystalline silicon film 3 are provided to prevent or minimize the occurrence of crystal defects of the substrate 1 due to stress applied by the thick silicon nitride film 4 during the local oxidation. However, at least the polycrystalline silicon film 3 may be omitted.

Figure 1A:
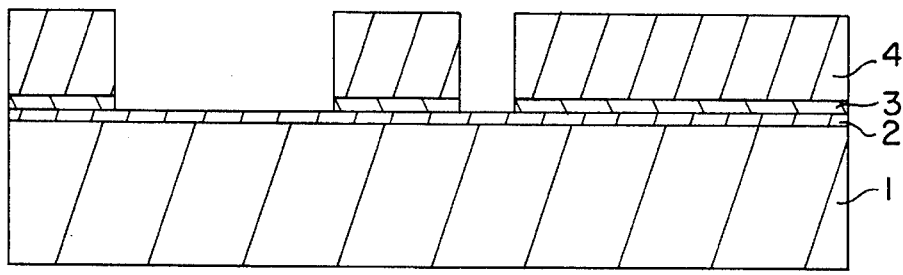
FIG. 1(a) to FIG. 1(d) are cross sectional views representative of respective steps of a method according to a prior art.
Figure 1B:
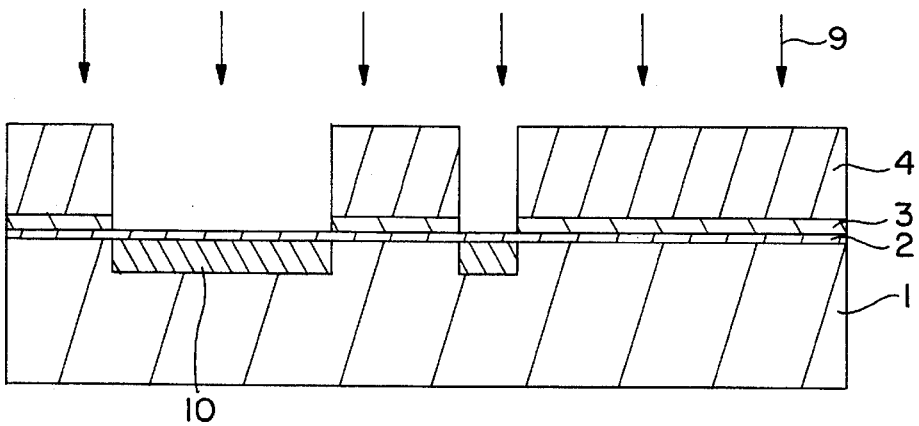
Figure 1C:
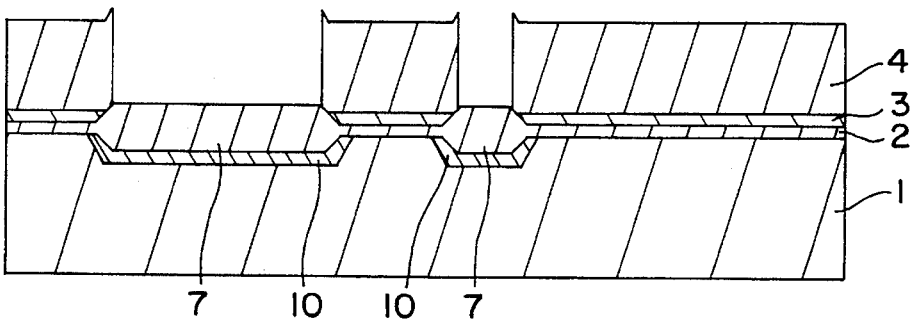
Figure 1D:
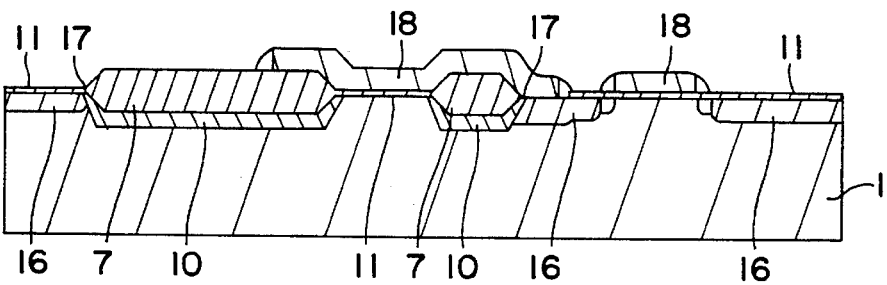
Figure 2A:
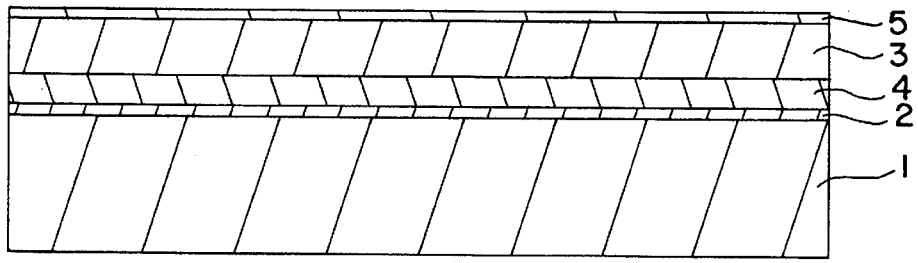
FIG. 2(a) to FIG. 2(f) are cross sectional views representative of respective steps of a method according to another prior art.
Figure 2B:
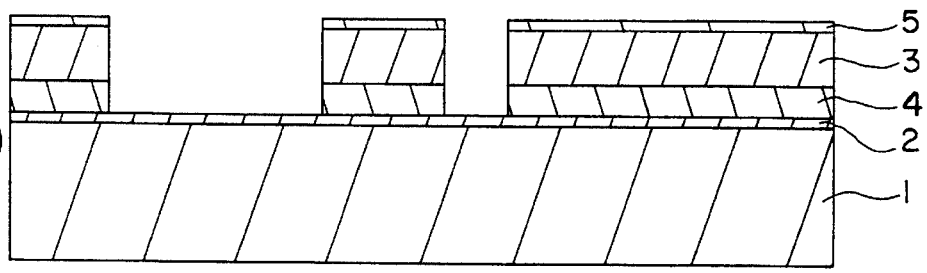
Figure 2C:
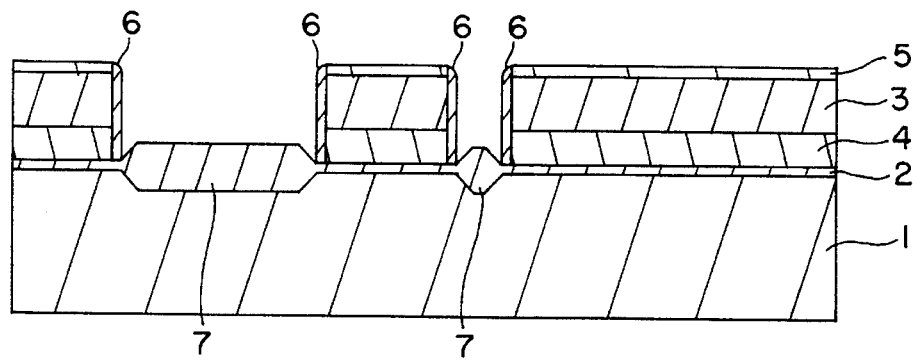
Figure 2D:
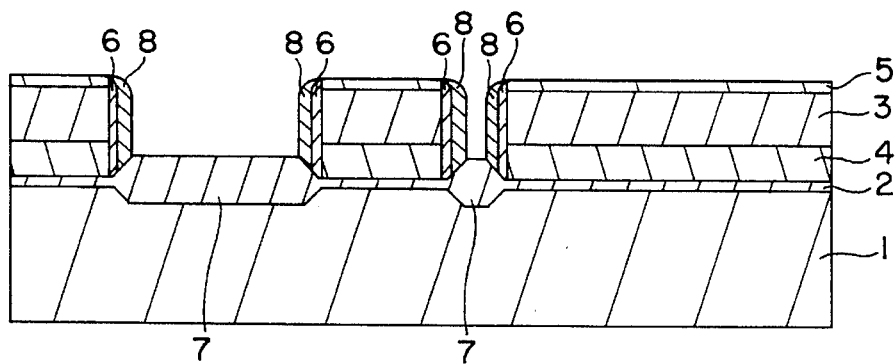
Figure 2E:
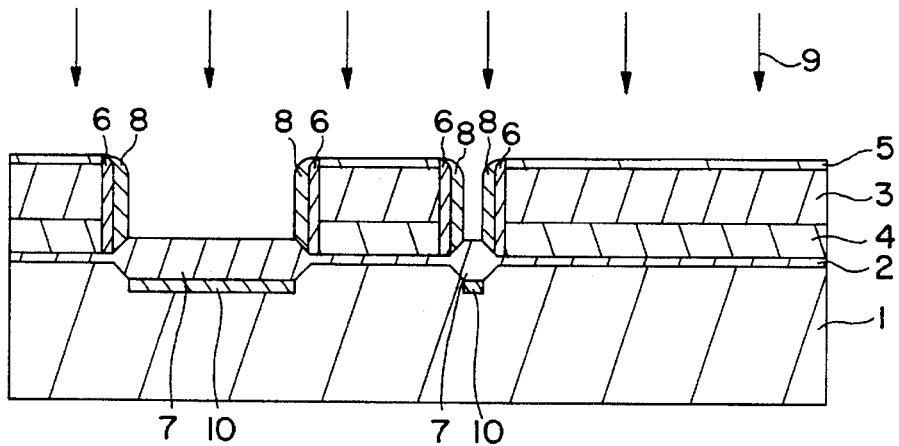
Figure 2F:
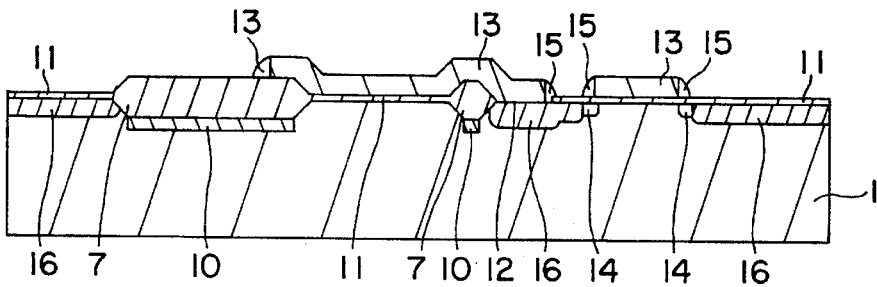
Figure 3A:
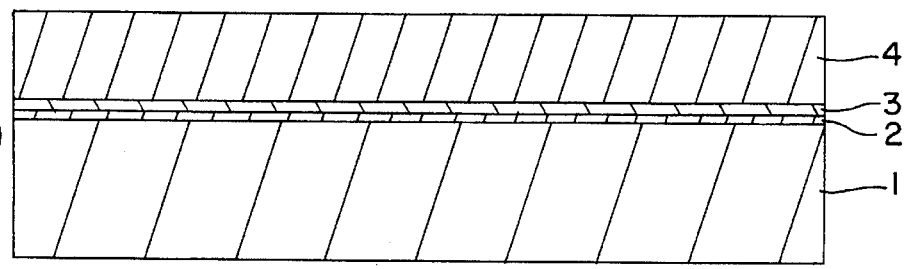
FIG. 3(a) to FIG. 3(e) are cross sectional views representative of respective steps of a method according to an embodiment of the present invention.
Figure 3B:
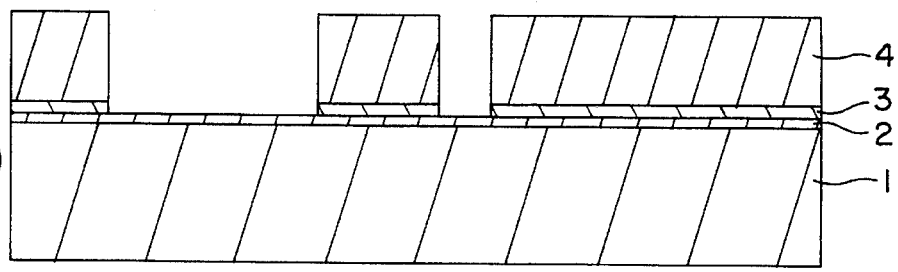

A photolithography process is then carried out to leave the first silicon nitride film 4 and polycrystalline silicon film 3 only on the element formation portions of the substrate 1, as shown in FIG. 3(b).

Figure 3C:
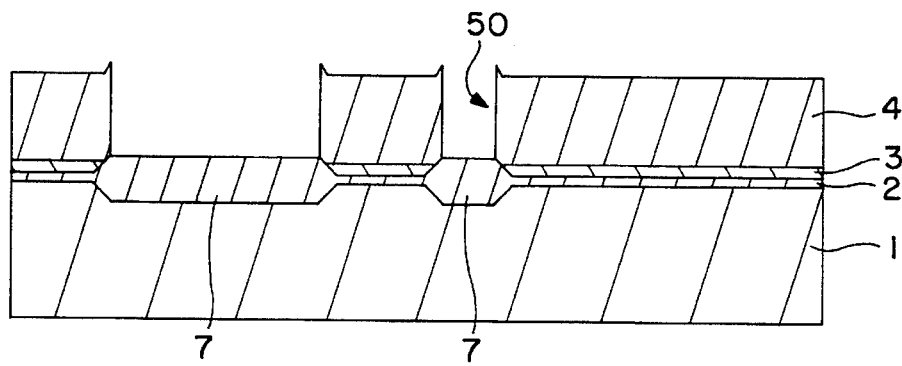

Local oxidation is thereafter carried out by using the first silicon nitride film 4 and polycrystalline silicon film 3 as a mask to form thereby field oxide films 7 with a thickness on the order of 300 nm on the element isolation regions, as shown in FIG. 3(c).

Figure 3D:
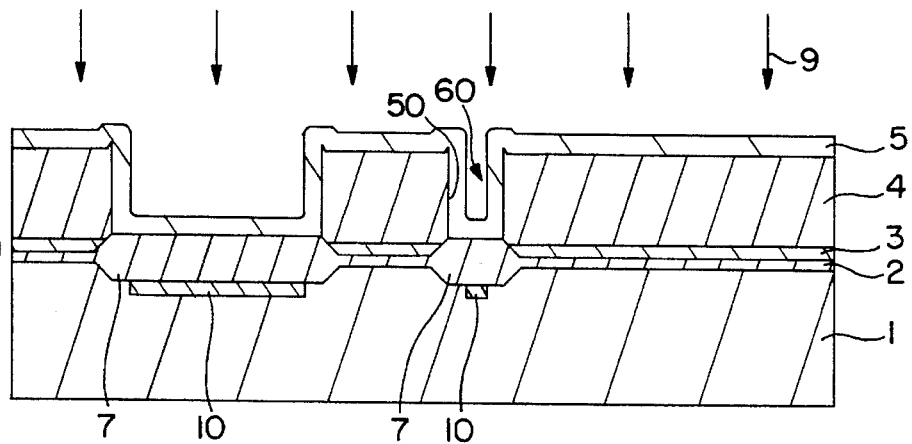

As shown in FIG. 3(d), a second silicon nitride film 5 with a thickness on the order of 200 nm is deposited on the entire surface by the CVD method. Boron ions 9 are then implanted, by using the second silicon nitride film 5, the first silicon film 4 and the polycrystalline silicon film 3 as a mask, to thereby form P-type channel stopper layers 10, as shown in FIG. 3(d). Here, the difference between the total film thickness of the second silicon nitride film 5, first silicon nitride film 4 and polycrystalline silicon film 3 remaining on the portions which are intended to be element formation regions and the total film thickness of the field insulation films 7 which are portions intended to be element isolation regions and second silicon nitride film 5 prevents the implantation of the boron ions 9 into the element formation regions and allows self-aligning formation of the P-type channel stopper layers 10. It is to be noted that the thickness of the second silicon nitride film 5 must be smaller than a half of the width of the smallest one of the openings, i.e. the opening 50 (see FIG. 3(c)) formed in the first silicon nitride film 4. This is because such opening 50 would be completely filled with the silicon nitride film 5 of the film 5 would have a thickness equal to or larger than a half of the width of the opening 50. In that case it would become impossible to form a hollow 60 (see FIG. 3(d)) defined by the part of the silicon nitride film 5 in the opening 50.

Subsequently, the silicon nitride film 5, first silicon nitride film 4, polycrystalline silicon film 3 and silicon oxide film 2 are removed.

A gate insulation film 11 with a thickness of approximately 20 nm is formed according to a conventional method for the preparation of semiconductor devices.

The gate insulation film 11 is patterned by photolithography to form a contact hole 12. An N-type high-concentration impurity layer 16 is formed under the contact hole 12 by thermal diffusion of phosphorus during later formation of gate electrodes.

CVD is used to form gate electrodes 13 with a thickness of approximately 300 nm on the gate insulation film 11. The gate electrodes 13 have a so-called polycide structure which is formed by thermal diffusion of phosphorus into the polycrystalline silicon and subsequent spattering of a compound of a high-melting metal Ti or W and Silicon (silicide).

The gate electrodes 13 are patterned by photolithography, after which an impurity (phosphorus) is implanted by an ion-implantation technique to form N-type low-concentration impurity layers 14.

Silicon oxide films 15 are formed on the field insulation films 7, gate electrodes 13 and N-type low-concentration impurity layers 14 by CVD.

Anisotropic dry etching is carried out to form silicon oxide film-made sidewalls 15 on the sides of the gate electrode is 13.

Figure 3E:
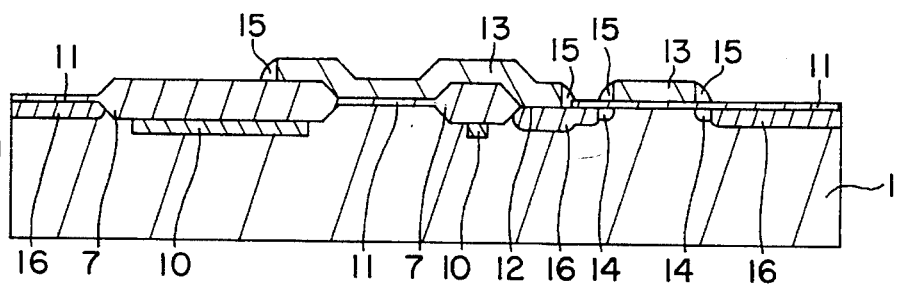

An ion-implantation technique is used for implantation of an impurity (arsenic) with the gate electrodes 13 and silicon oxide film-made sidewalls 15 as the mask to form N-type high-concentration impurity layers 16, thus establishing the structure shown in FIG. 3(e).

Although the insulation film on the first silicon nitride film 4 is formed with the silicon nitride film 5 in the above embodiment, the insulation film may be formed with polycrystalline silicon or silicon oxide according to another embodiment. The latter embodiment may be carried out by just following the method for the preparation illustrated in FIG. 1(a) through FIG. 1(e), but merely substituting a second polycrystalline silicon film 5 or silicon oxide film 5 for the second silicon nitride film 5, and thus presentation of additional drawings is omitted.

According to the present invention, since no etchback process by dry etching is used for provision of recess portions on the element isolation regions which are narrower than the element isolation regions prior to local oxidation thereof, decrease in the film thickness of the thick insulation films formed by local oxidation may be minimized, and lowering in the threshold voltage of the parasitic MOS transistor due to decreased film thickness may be prevented.

In addition, since the present invention is a simple process which forms an insulation film over the entire surface and provides recess portions on the element isolation regions which are narrower than the element isolation regions prior to local oxidation thereof, there are no problems of lower yields and increased cost.

Although the invention has been described with reference to specific embodiments, this description is not meant to be construed in a limiting sense. Various modifications of the disclosed embodiments will become apparent to ordinary persons skilled in the art upon reference to the description of the invention. It is therefore contemplated that the appended claims will cover any modifications or embodiments as fall within the true scope of the invention.

What is claimed is:

1. A method for forming a semiconductor device comprising the steps of:

providing a semiconductor substrate having an element formation portion and an element isolation portion;

covering said element formation portion of said semiconductor substrate with a mask layer having a top layer made of an oxidation-resist layer;

selectively oxidizing said semiconductor substrate by using said mask layer as a mask to form a field oxide layer on said element isolation portion of said semiconductor substrate;

forming a film on a entire surface of said field oxide layer; and selectively implanting impurities into said semiconductor substrate to form a channel stopper region under said field oxide layer while leaving said film.

2. A method as claimed in claim 1, wherein each of said oxidation-resist layer and said film is made of silicon nitride.

3. A method as claimed in claim 1, wherein said oxidation-resist layer film is made of silicon nitride and said film is made of polycrystalline silicon.

4. A method as claimed in claim 1, wherein said oxidation-resist layer film is made of silicon nitride and said film is made of silicon oxide.

5. A method as claimed in claim 1, wherein said film has a thickness that is smaller than a half of a width of said element isolation portion of said semiconductor substrate.

6. A method for the preparation of semiconductor devices which contains formation of insulation films for isolation of elements on a semiconductor substrate, comprising steps of:

forming a silicon nitride film on said semiconductor substrate;

selectively removing said silicon nitride film;

forming an insulation oxide film on said semiconductor substrate with said silicon nitride film as a mask;

forming an interlayer film on said silicon ride film and said insulation oxide film;

implanting an impurity through said interlayer film to form impurity layer under said insulation oxide film; and removing said nitride film and said interlayer film.

7. A method for the preparation of semiconductor devices as claimed in claim 6, wherein said interlayer film is a silicon nitride film.

8. A method for the preparation of semiconductor devices as claimed in claim 6, wherein said interlayer film is made of polycrystalline silicon.

9. A method for the preparation of semiconductor devices as claimed in claim 6, wherein said interlayer film is made of silicon oxide.

10. A method for the preparation of semiconductor devices comprising steps of:

forming a silicon oxide film and a polycrystalline silicon film in that order on a semiconductor substrate;

forming a silicon nitride film on said polycrystalline silicon film;

selectively removing said polycrystalline silicon film and said first silicon nitride film to expose said silicon oxide film;

forming a field-oxide film on said semiconductor substrate with said silicon nitride film as a mask;

forming an interlayer film on said field-oxide film and said silicon nitride film;

implanting an impurity through said interlayer film to form an impurity layer under said field-oxide film; and removing said interlayer film, said first nitride film, said polycrystalline film and said silicon oxide film.

\* \* \* \* \*